United States Patent
Ancona

[11] Patent Number: 5,838,021
[45] Date of Patent: *Nov. 17, 1998

[54] SINGLE ELECTRON DIGITAL CIRCUITS

[76] Inventor: Mario G. Ancona, 724 S. St. Asaph St., Alexandria, Va. 22314

[21] Appl. No.: 773,155

[22] Filed: Dec. 26, 1996

Related U.S. Application Data

[60] Provisional application No. 60/018,347, Dec. 26, 1995.

[51] Int. Cl.$^6$ ....................................... H01L 29/06
[52] U.S. Cl. ................................... 257/30; 257/9
[58] Field of Search ................... 257/9, 25, 30, 257/14, 236, 241, 243, 235, 38, 39

[56] References Cited

U.S. PATENT DOCUMENTS 5,665,979  9/1997  Takahashi et al. ..................... 257/30

OTHER PUBLICATIONS

M.G. Ancona et al., Simple Computation Using Coulomb Blockade–Based Tunnelling Arrays, J. Appl. Phys, 77(1), (Jan. 1, 1995).

M.G. Ancona, Design of Computaionally Useful Single-Electron Digital Circuits, J. Appl. Phys. 78(12) (Dec. 15, 1995).

Letter from Klingensmith to Miles re reference AA, above.

R.W. Rendell, Effect of Polarization Screening Length on Electron–Pump Cotunneling Errors, Physical Review B, 52, 4684 (No. 7, (Aug. 15, 1995).

M.G. Ancona, Systolic Processor Designs Using Single-Electron Digital Circuits, Superlattices and Microstructures, vol. 20, No. 3 (1996).

J. Martinis et al., Metrological Accuracy of the Electron Pump, Physical Review Letters, 72, 904 (No. 6, Feb. 7, 1994).

M.W. Keller et al., Accuracy of Electron Counting Using a 7–Junction Electron Pump, Applied Physics Letters, 69, 1804 (No. 12, Sep. 16, 1996).

L.J. Geerligs et al., Frequency–Locked Turnstile Device for Single Electrons, Physical Review Letters 64, 2691 (No. 22, May 28, 1990).

G. Zimmerli et al., Voltage Gain in the Single Electron Transistor, Applied Physics Letters 61, 2616 (No. 21, Nov. 23, 1992).

M. Ancona, Single–Phase Single Electron Digital Circuits, Journal of Applied Physics 81, 3311 (No. 7, Apr. 1, 1997).

*Primary Examiner*—Jerome Jackson
*Assistant Examiner*—Nathan K. Kelley
*Attorney, Agent, or Firm*—Thomas E. McDonnell; Edward F. Miles

[57] ABSTRACT

Disclosed are single electron digital devices, in which the screening lengths of individual device islands are between 0.5 and 1.0 islands. This range permits island occupancy to be bias independent, permitting the devices to hold or process digital information independent of device biases. This range of screening lengths can be effected by choice of device parameters which are sufficiently modest to permit practical fabrication of these devices.

5 Claims, 7 Drawing Sheets

SINGLE ELECTRON DIGITAL CIRCUITS

This application has the priority of Provisional Application No. 60/18,347, filed Dec. 26, 1995. This application also relates to subject matter discussed in the papers by M. G. Ancona et al., Simple Computation Using Coulomb Blockade-Based Tunneling Arrays, J. Appl. Phys., 77(1) (cover date Jan. 1, 1995) at p. 393; and M. G. Ancona, Design of Computationally Useful Single-Electron Digital Circuits, J. Appl. Phys., 78(12) (cover date Dec. 15, 1995). Both papers are incorporated herein by reference for all purposes.

BACKGROUND OF THE INVENTION

A continuing trend in digital electronics is ever decreasing component size to increase the frequency range of devices and the complexity of calculation performable in a given space. Single electron technology has gained attention as a possible successor to the current technology, because single electron devices can, in principle, be made orders of magnitude smaller than current devices. Single electron technology is based on tunnel junctions which demarcate between them "islands" in which a single electron can locate upon application of external biasing potentials to permit crossing tunnel junction barriers. An important parameter characterizing single electron devices is screening length, the distance over which presence of an electron in one island will influence occupation of other islands. Heretofore, research on single electron devices has focused on physical understanding and on metrology rather than on circuit design, and the screening lengths have been made relatively large so as to accentuate collective effects and to decrease error rates. This, however, means that in such devices one can maintain a desired configuration of filled or empty islands only by maintenance of external occupancy-dependent biasing. As a result, the occupancy patterns in these devices constituted a mirror image of the external bias condition, and could contain no separate information. Until single electron circuits can maintain occupancy states independent of external biasing, they will have no computational usefulness.

SUMMARY OF THE INVENTION

Accordingly, an object of the invention is to permit computationally useful operation of single electron digital circuits.

Another object is to provide single electron digital circuits with screening lengths which are sufficiently short to permit island occupancy to be bias independent.

Another object is to do the foregoing with screening lengths which are realistic to fabricate.

In accordance with these and other objects made apparent hereinafter, the invention concerns single electron devices in which the screening lengths are between about 0.5 and 1.0 islands.

These screening lengths are sufficiently small to permit electron occupancy of an island under external bias, regardless of the occupancy states or biasing of nearby islands. The literature indicates that screening lengths of this type are realistically fabricatable.

These and other objects are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

BRIEF DESCRIPTION OF THE DRAWINGS

FIG. 3b is a timing diagram for the circuit of FIG. 3a.

FIG. 4a is a schematic illustrating a single electron switch.

FIG. 4b is the timing diagram for the circuit of FIG. 4a.

FIG. 5b is the timing diagram for the circuit of FIG. 5a.

DETAILED DESCRIPTION

Figure 1:
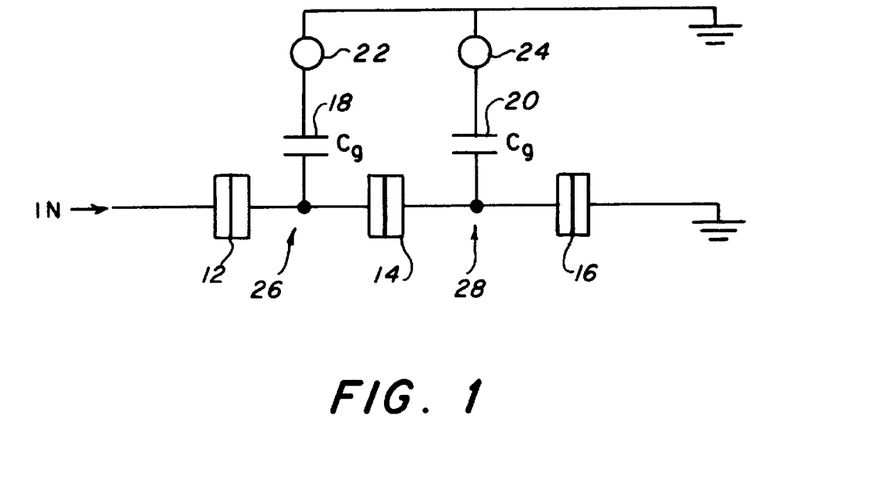
FIG. 1 is a schematic illustrating a two island Coulomb blockade circuit.

With reference to the drawing figures, wherein like numbers indicate like parts throughout the several views, FIG. 1 schematically shows two low capacitance islands connected in series. Tunnel junctions 12, 14, 16 delimit between them the two islands, which are biased by controllable external potential sources 22 and 24 capacitatively coupled to the respective islands 26 and 28 by capacitors 18 and 20, each of which has a capacitance $C_g$. Assuming an adequate supply of available input electrons at "IN," a voltage island 26 to become sufficiently positive to overcome the Coulomb blockade barrier at junction 12, and an electron traverses junction 12 and is bound in island 26. A similar application of a sufficiently large potential at 24 would cause the electron to move from island 26 to island 28. If however, an electron were residing in island 28, and the potential 22 were enabled to attempt bringing an electron to island 26, the presence of the electron in island 28 would tend to oppose entry at island 26. This felt presence in adjacent islands of an electron residing in another island, which electrostatically modifies the Coulomb blockade conditions and interferes with normal tunneling transitions is the screening referred to above. The length in a circuit over which the presence of one electron will significantly interfere with tunneling transitions is the screening length. In most existing single electron devices, the screening lengths are relatively large, typically spanning many islands. This means that in order to maintain a desired configuration of electrons in a single electron device, an occupancy-dependent set of potentials will be required to maintain desired electrons in desired islands, notwithstanding screening interference. This means that the biasing of device islands must necessarily mirror electron occupancy of the corresponding islands, and cannot vary therefrom, rendering such circuits of no computational value. For this reason, conventional single electron circuits, e.g. multistage electron pumps, typically have only one electron in them at one times and that electron moves abut under the precise control of the external biases.

Figure 2:
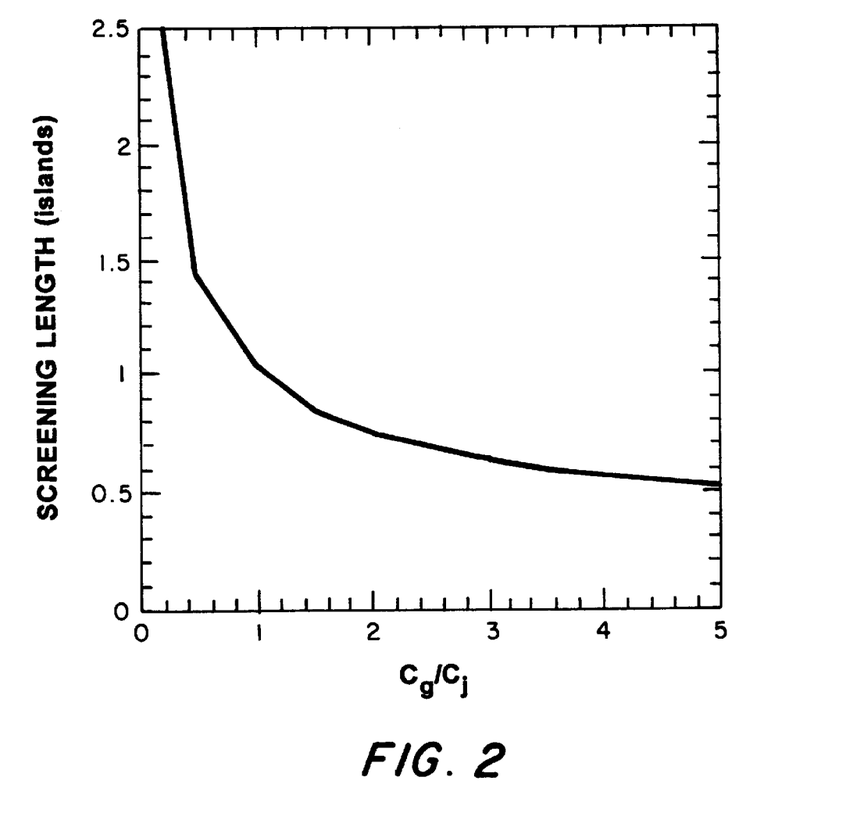
FIG. 2 is a graph showing the effects of circuit capacitance on screening length.

FIG. 2 illustrates the relationship between screening length measured in islands, and the ratio of $C_g/C_j$, where $C_j$ is tunnel junction capacitance. The curve was generated from Kirchoff's laws as applied to an equivalent circuit. See, N. S. Bakhralov et al., *Sov. Phys.JETP*, 68, 581 (1989). From it one can see that the curve rises sharply above 1.0 islands, and becomes flat as it approaches 0.5 islands. This range of screening lengths from about 0.5 to 1.0 is achievable experimentally and is short enough to suppress unwanted electron-electron interactions but not so short that the islands are completely isolated, suggesting the possibility of devices in which residence of an electron in any given island does not depend uniquely on the application of a biasing signal to hold it there. In order to minimize circuit size, one would want to put electrons as close together as possible; to accomplish this without creating unwanted electron-electron interactions, the screening length must be minimized. At the same time, the screening length can not be made so short that the Coulomb islands become electrically isolated. In addition, for practical reasons, the capacitance ratio needed to achieve these screening lengths should not be too large either. The range of 0.5 to 1.0 screening lengths for each Coulomb island satisfies these criteria.

Figure 3A:
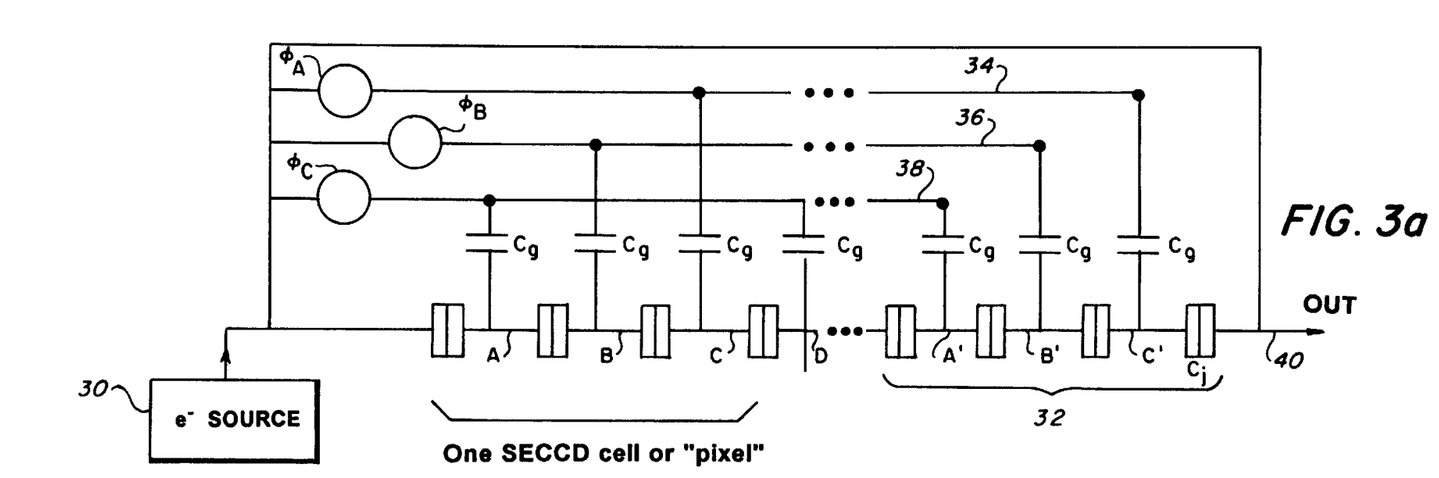
FIG. 3a is a schematic illustrating a shift register circuit.
Figure 3B:
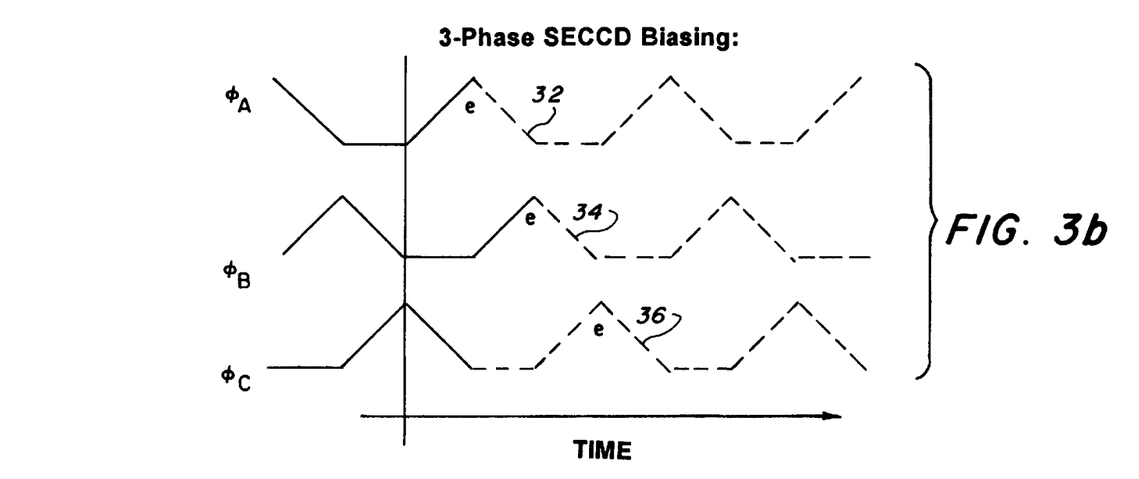

FIG. 3a shows a basic device using a plurality of islands having screening lengths in this range. Islands a, b, c have associated biases $\Phi_a$, $\Phi_b$, and $\Phi_c$ which are externally controllable. These biases also have associated "phases," with respect to one another (and hence use of the nomenclature "$\Phi$") which are the sequences in which these respective potentials are made high. FIG. 3b shows these phasing sequences. The amplitudes of these sequences have been determined from stability diagrams derived from the orthodox theory of Coulomb blockade. Similarly, all subsequent electron behavior described in this document has been determined from stochastic tunneling simulations. At time zero, potential $\Phi_a$ goes high (32), and the other two potentials remain low. This causes an electron to be pulled from electron source 30 into island A. This transition is indicated in FIG. 3b by an "e" residing beneath the corresponding control potential transition 32. At the next system timestep, $\Phi_a$ becomes low and $\Phi_b$ becomes high (34), causing the electron in island A to tunnel to island B. At the third system timestep, $\Phi_c$ becomes high (36), transferring the electron to island C. Thereafter, the sequence 32, 34, 36 is repeated which causes the electron to transfer to island D, the first island of the next adjacent pixel. In this manner, an electron entering the system from source 30 is marched sequentially across islands A, B, C, D, etc. The pattern of three such islands is repeated by junctions A', B', C', which have the same-phased biasing via parallel connections 34, 36, 38 as islands A, B, C. Because the screening length of the all the islands in the circuit is chosen to be in the aforementioned range, any electron or biasing downstream of island C will not interfere with a new electron entering island A at the fourth timestep. Thus an electron injected into the circuit from source 30 would transition all the sets of three consecutive islands, and finally exit the system at 40, and would do so independent of any occupancy outside its own set of three islands. In this manner, the circuit operates as a shift register to move single electrons from source 30 to output 40. If source 30 represents an informational signal, e.g. a digital signal in which 1's and 0's correspond to the presence or absence of an electron, the circuit of FIG. 3a acts like a conventional shift register. The basic unit of the shift register is a set of three consecutive islands controlled by potentials $\Phi_a$, $\Phi_b$, $\Phi_c$, such as islands A, B, C, denominated a "pixel" in FIG. 3a. Each pixel of the circuit corresponds, to one "bit" of a digital word, and, of course, any signal from source 30 would be similarly structured. Because the screening length of the islands is smaller than the pixel length, and source 30 will ensure that there will be at most one electron in a pixel at a time, the biasing of islands in the circuit of FIG. 3a is independent of electron residence in any island. Three islands per pixel is a minimum configuration to permit proper phasing, and more islands are possible. In principle one could have a large number of islands per pixel and conventionally large screening lengths. This, however, increases circuit size and complexity, obviating some of the advantages of small scale which single electron technology has over conventional semiconductor technology. The choice of 0.5 to 1.0 islands screening length represents a range which is large enough to ensure that electrons on islands are not effectively isolated from adjacent circuitry, but not so large as to lose the scaling advantages of single electron technology.

Figures 4A, 4B:
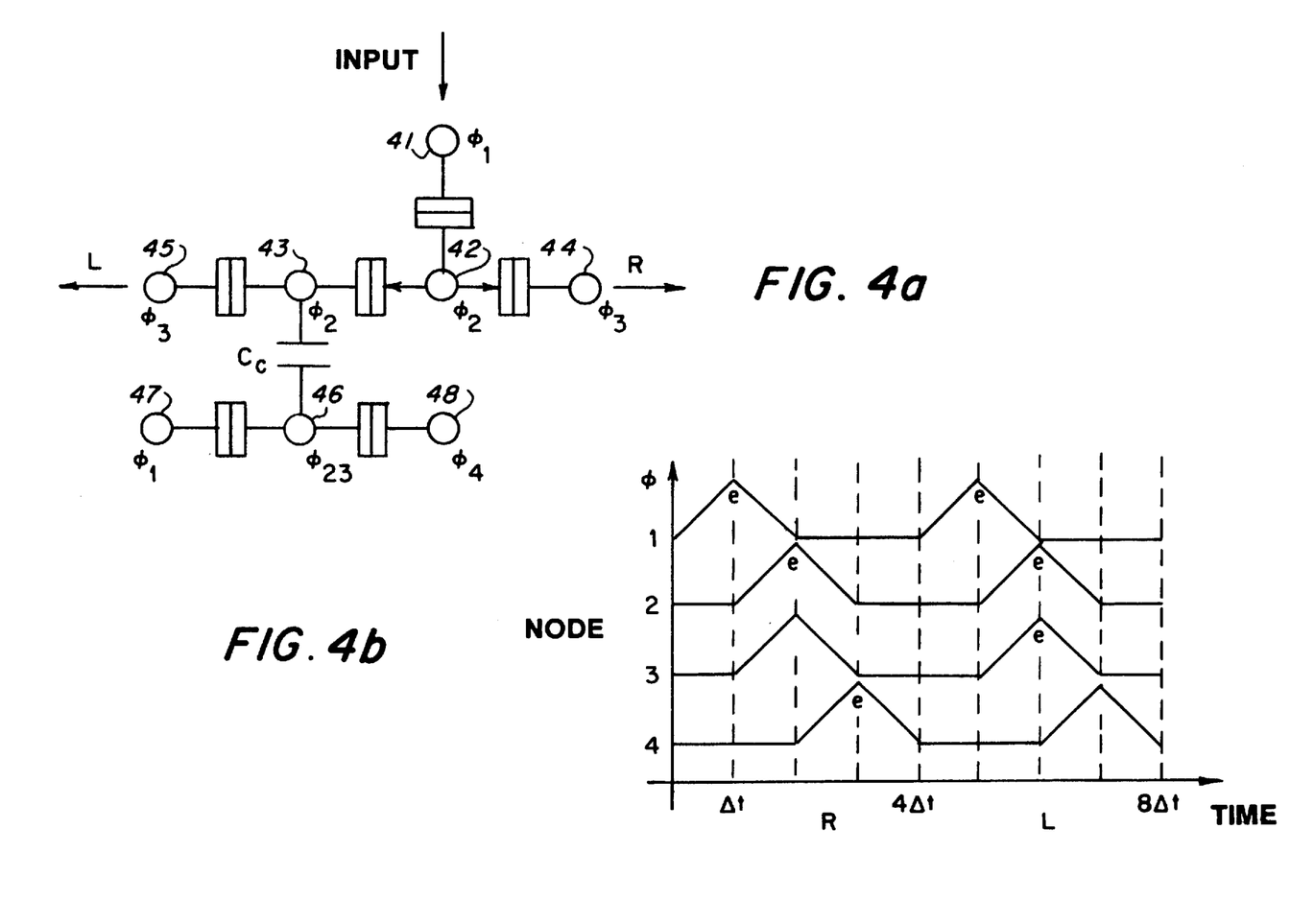

FIG. 4a shows a single electron digital switch. Each island has associated with it a biasing potential, denoted $\Phi_1$ through $\Phi_4$, including $\Phi_{23}$ which indicates that the associated island is biased on whenever $\Phi_2$ or $\Phi_3$ is biased high. The input to island 41 may be a shift register of the kind above described. FIG. 4b shows the phase-biasing for the switch, in which each timestep is $\Delta t$ in length. In the absence of electrons in islands 46 through 48, at the first timestep $\Phi_1$ is high, which moves any electron at the input to island 41. At timestep 2, $\Phi_2$ goes high, moving any electron in island 41 to island 42. The islands 42 and 43 are biased by $\Phi_2$ and are both high at timestep two. However, because capacitor $C_c$ capacitatively loads island 43, an electron in island 42 would tunnel to it. There the electron resides until the third timestep, at which $\Phi_3$ goes high again, causing the electron to tunnel to island 45, and out of the circuit. Control islands 47, 46, and 48 also constitute a shift register. If at the first timestep, a control electron bit is clocked into island 47, and at the second timestep to island 46, it resides there until the third timestep, at which time it is clocked out ($\Phi_4$) to island 48 and out of the circuit. If at the second timestep an electron enters control island 46, it is electrostatically coupled to island 43 via capacitor $C_c$. The electrostatic repulsion prevents an electron on island 42 from tunneling to island 43, and the electron at island 42 remains there during the second timestep. At the third timestep, an electron at island 42 will tunnel to island 44 and out of the circuit. In the fourth timestep all biases are zero (except on island 48), and then the cycle repeats. In this manner, one bit from an informational signal input at 41, and one bit of the control signal input at 47, each moves through the circuit during one cycle of four timesteps. However, the bits of the informational signal are routed right or left (through islands 44 or 45, respectively) depending only on the state of control island 46. In either case, the bias sequences are identical. Note also that if no electron is input at 41 then no electron appears at islands 44 or 45. Thus the circuit constitutes a digital switch.

In the circuit of FIG. 4a the capacitive coupling between islands 43 and 46 prevents entry of a tunneling electron into either island so long as the other island is occupied. This can be characterized as causing these two islands to occasionally have screening lengths of greater than 1. For purposes of this application, screening length of a Coulomb island is determined absent coupling from non-adjacent neighboring islands.

Figure 5A:
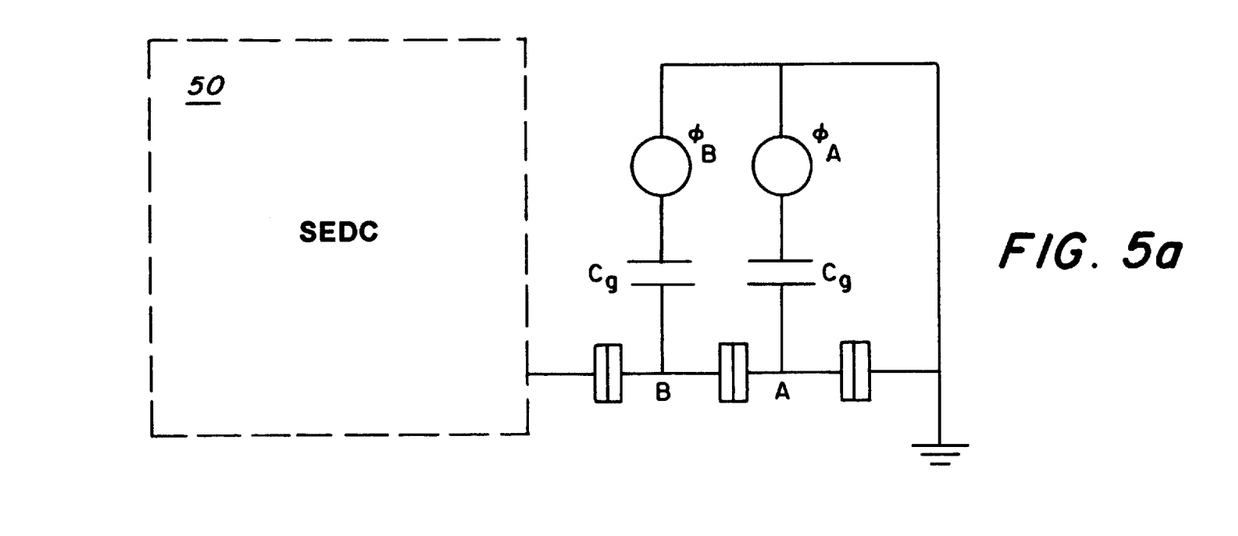
FIG. 5a is a schematic illustrating a single electron source-sink circuit.
Figure 5B:
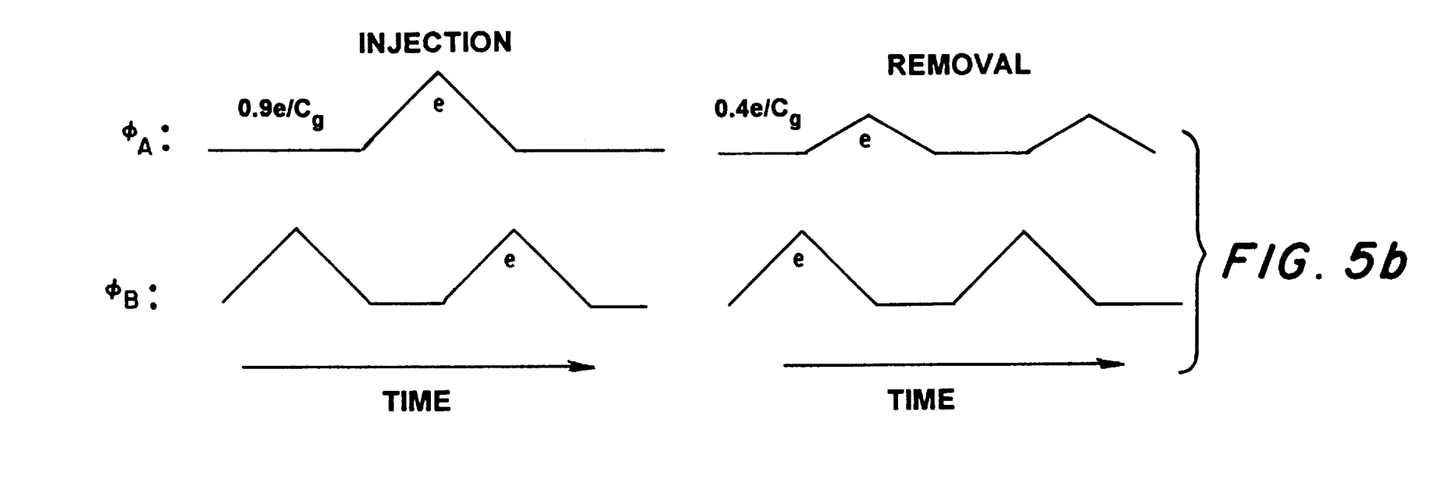

FIG. 5a shows a circuit to provide a source of electrons for single electrons circuits, or as a sink. The circuit consists of two islands A and B, and respective biases $\Phi_a$ and $\Phi_b$. FIG. 5b shows the bias-phasing for the circuit. When injection of a source electron is desired, $\Phi_a$ is made high to draw an electron from ground, and then the biases reverse to have $\Phi_b$ draw the electron to island B, where it is available to single electron circuit 50. If, however, one wishes to remove electrons from circuit 50, making $\Phi_b$ high draws an output electron to island B, and then making $\Phi_a$ high and $\Phi_b$ low moves it to island A. To obtain the desired function, the high potential for $\Phi_a$ is made sufficiently low so that the bias is insufficient to draw an electron from ground, but is sufficient to draw it from island B. In FIG. 5b, this lower potential is $0.4e/C_g$, where e is an elementary charge unit, compared to $0.9e/C_g$ otherwise. Once in island A, the bias $\Phi_a$ falls to zero and the electron in island A will tunnel naturally to ground and be discharged.

Figure 6:
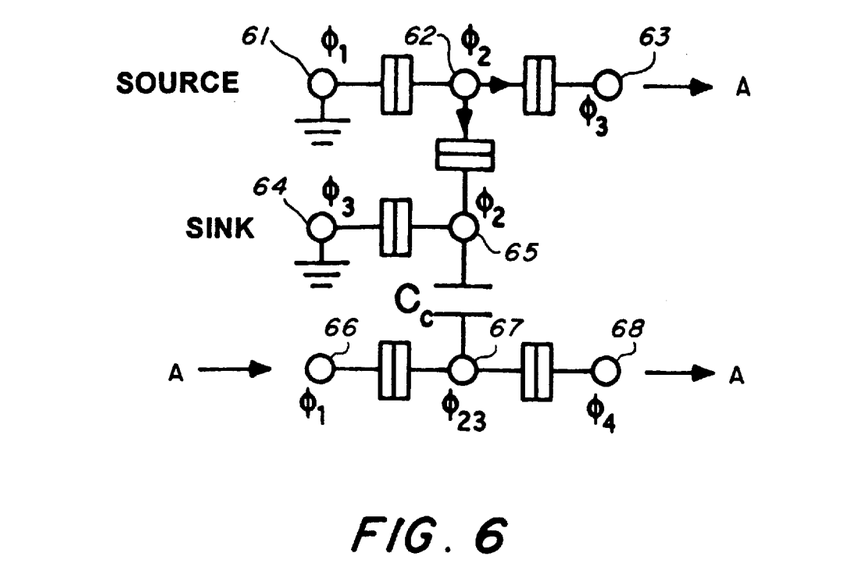
FIG. 6 is a single electron fan-out circuit.

FIG. 6 shows an application of the switch of FIG. 4 in the form of a fan-out device, i.e. one which makes a bit-wise copy of an input digital signal. The circuit processes one bit in four timesteps, and phase-potentials $\Phi_1$ through $\Phi_4$ in FIG. 6 indicate the timesteps at which the corresponding islands have high bias. At timestep 1, a bit from a signal A is input to island 66. Simultaneously an electron is input to island 61 from an electron source, e.g. the one described above in connection with FIG. 5. At the second timestep, the electron in island 61 is clocked to island 62, and any electron in island 66 is clocked to island 67. Islands 65 and 67 are capacitatively coupled, and island 65 is biased high at the second timestep, so any electron entering island 62 will naturally continue to island 65, and thence to sink 64 at the third timestep. However, if the relevant bit of signal A is a digital "1," island 67 will have an electron during the second and third timesteps, when it is biased high. An electron in island 67 will be electrostatically coupled to island 65 through capacitor $C_c$, blocking tunneling between islands 62 and 65 during the second (and third) timestep(s). The third timestep $\Phi_3$ clocks out this electron to island 63. In this manner, presence or absence of an electron in island 67 causes passing an electron from source 61 to either output 63 or sink 64, and thus the output at 63 is a replica of the input at 66 (which is output unmodified at 68).

Figure 7:
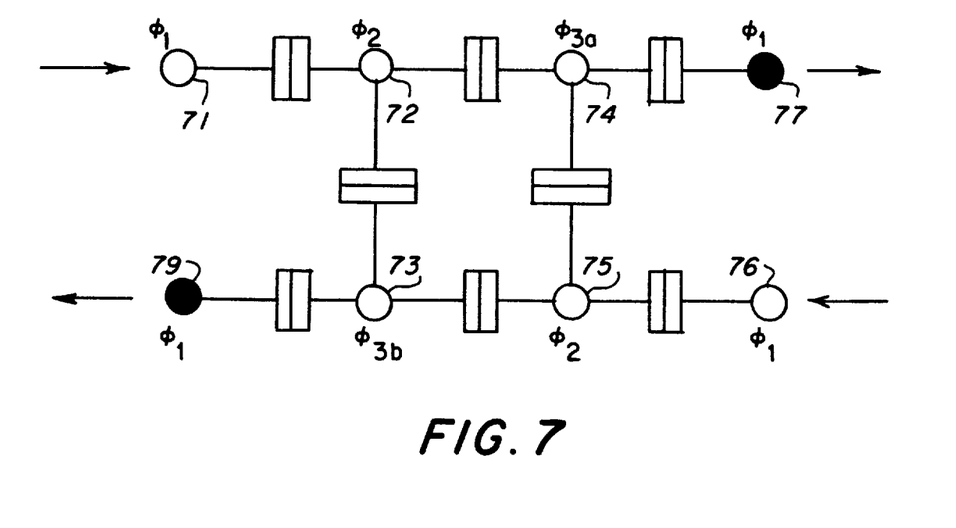
FIG. 7 is a schematic illustrating a single-electron circuit for simulating a class of one dimensional diffusion problems.

FIG. 7 shows a circuit for performing simulations of linear diffusion in the presence of a body force, examples of which occur in heat conduction, electron transport in semiconductors, and ionic diffusion. Islands 71, 72, 74 and 77 constitute one cell of a shift register, and islands 76, 75, 73, and 79 constitute one cell of another register, each of which clocks electrons in opposite directions, as indicated by the arrows on FIG. 7. Tunnel junctions 78 and 79 connect the two cells together to permit electrons in one to move to the other. In operation, an input bit is clocked in at $\Phi_1$ to islands 71 and 76, and at $\Phi_2$ to islands 72 and 75. At $\Phi_3$ islands 74 and 73 are clocked high, at which time any electron in island 75 will go to either island 74 or 73, with probability depending on the relative magnitudes of $\Phi_{3a}$ and $\Phi_{3b}$, and similarly any electron in island 72 goes to either island 73 or 74. If $\Phi_{3a}=\Phi_{3b}$ the probabilities are equal and this corresponds to the case of zero body force. Asymmetry in $\Phi_{3a}$ and $\Phi_{3b}$ acts as a body force on the electrons tending to make them go preferentially in one direction. In this manner, electrons from one shift register can transfer to the other, and the aggregate flow of electrons within the circuit simulates one-dimensional diffusion in the presence of a possibly spatially varying body force.

Figure 7A:
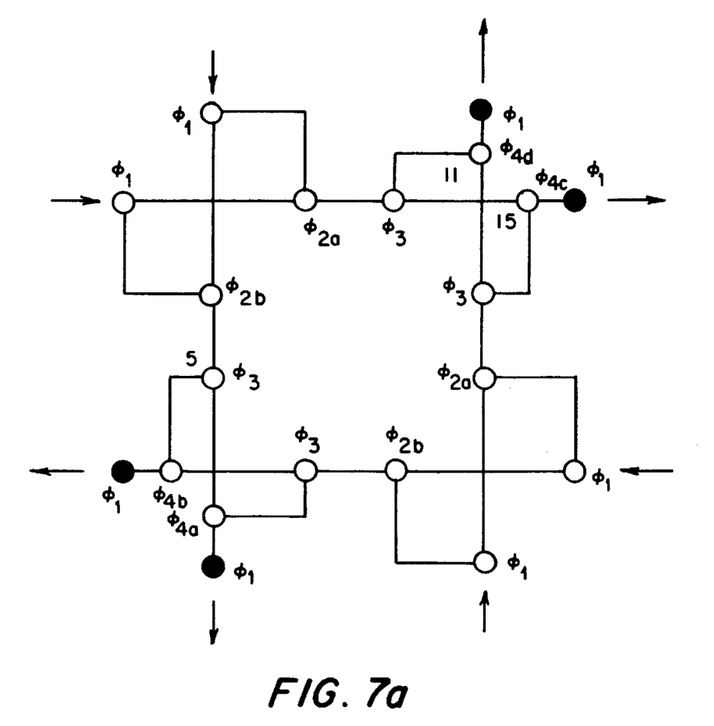
FIG. 7a is a schematic illustrating a circuit for performing the class of diffusion problems as does the circuit of FIG. 7, but in two dimensions.

FIG. 7a shows the circuit of FIG. 7 extended to two dimensional diffusion, with inputs and outputs as indicated by arrows on the drawing figure. Otherwise the operation of the circuit of FIG. 7a is that of FIG. 7.

Figure 8:
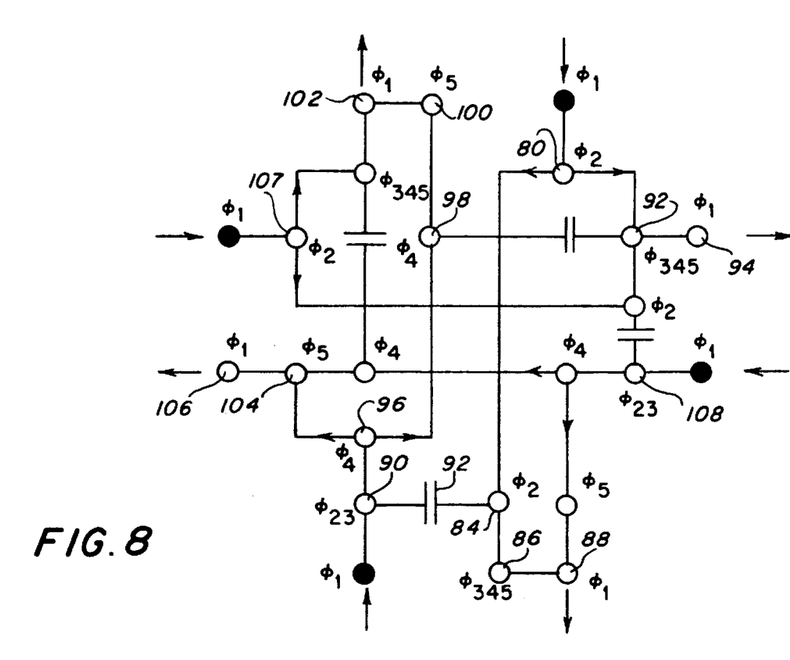
FIG. 8 is a schematic illustrating a circuit for simulating fluid flow in, two dimensional diffusions.

The circuit of FIG. 8 performs a lattice-gas simulation of low Reynolds number Navier-Stokes fluid mechanics in two dimensions. The circuit counterpropagates electrons in the directions of the arrows in FIG. 8. An electron entering island 80 at $\Phi_2$ would, in the absence of other electrons in the circuit, immediately go to island 84, thence to island 86 at $\Phi_3$ through $\Phi_5$ and finally exit the circuit in the same direction it entered at island 88 when $\Phi_1$ repeats. If, however, island 90 contains an electron, its coupling to island 84 via capacitor 92 will cause any electron in island 80 to remain there, and at $\Phi_3$ through $\Phi_5$ reside in island, where it is then clocked out of the circuit via 94 when $\Phi_1$ repeats. Thus, depending on whether island 90 is occupied, an electron entering island 80 could either be scattered (island 94) or traverse the circuit unscattered (island 88). Similarly, if at $\Phi_4$ island 90 is occupied, at $\Phi_4$ its electron will go to islands 96 and 98, and thence out of the circuit via 100, 102 at $\Phi_5$ and the next occurrence of $\Phi_1$ unless island 92 is occupied. This blockades the transition from island 96 to 98, and permits an electron in island 96 to go out of the circuit in a different direction via islands 104 and 106 at $\Phi_5$, and the next repetition of $\Phi_1$ The circuit is symmetrical, so that an electron entering at island 107 will exit at 94 or be scattered to island 102 in the same manner that an electron entering at 80 exited at either 88 or 94 (with the key to scattering being the occupancy of island 108 at $\Phi_2$ and $\Phi_3$). Likewise, an electron resident on island 108 at $\Phi_3$ will exit at island 106 or be scattered to island 88, depending on the occupancy of island 107 at $\Phi_2$ in the same manner that an electron resident on island 90 is goes to either island 102 or 106 depending on occupancy of island 84 at $\Phi_2$. This well-defined "scattering" of the electrons in the circuit replicates the known scattering rules employed in the fluid mechanics lattice-gas algorithm of Hardy et al. (J. Math. Phys, 14, 1746 (1973)). This means that in a circuit constituted of numerous replications of the cell in FIG. 8, the averaged electron density will obey Navier-Stokes fluid mechanics and thus computes or simulates this behavior.

Figure 9:
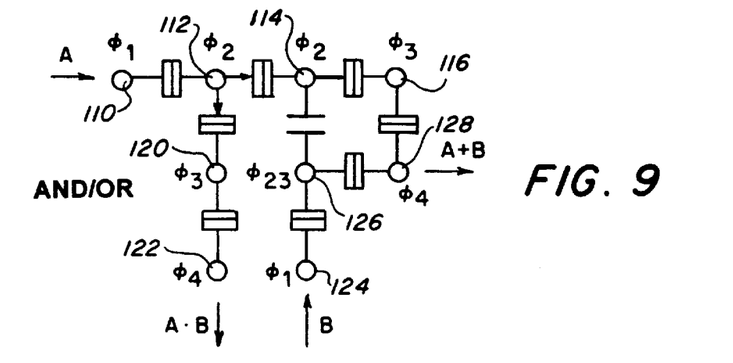
FIG. 9 is a schematic illustrating a circuit for performing logical "AND" and "OR" computations.

FIGS. 9–13 show various digital logic circuits based on the single-electron switch of FIG. 4. FIG. 9 is a circuit for producing the logical "AND" and logical "OR" of digital inputs A and B. An input bit from A enters at island 110 at $\Phi_1$ and, in the absence of an electron at island 126, proceeds to island 112 and 114 at $\Phi_2$, to island 116 at $\Phi_3$, and exits the circuit via island 128 at $\Phi_4$. Island 112 has a parallel path to island 120, but without an electron in island 126, an electron in island 112 preferentially goes to island 114 and thence to 128 because of its capacitive loading by 118. However, if a synchronous electron bit from input B enters island 124 at $\Phi_1$, and is clocked to island 126 for $\Phi_2$ and $\Phi_3$. When switching island 126 is occupied it directs an electron from A at 112 to 122. Again, if 126 is not occupied, an electron at 112 will pass to 128. Thus an electron can arrive at 122 only if the bits from A and B are both 1. In this manner output at 122 is the logical "AND" of A and B. Similarly, if the bit from B is zero, then a bit from A goes to island 114 and ultimately 128; whereas all bits from B go to island 128. Thus island 128 will be occupied whenever the A or B bit is a one, and output via island 128 represents the logical "OR" of A and B.

Figure 10:
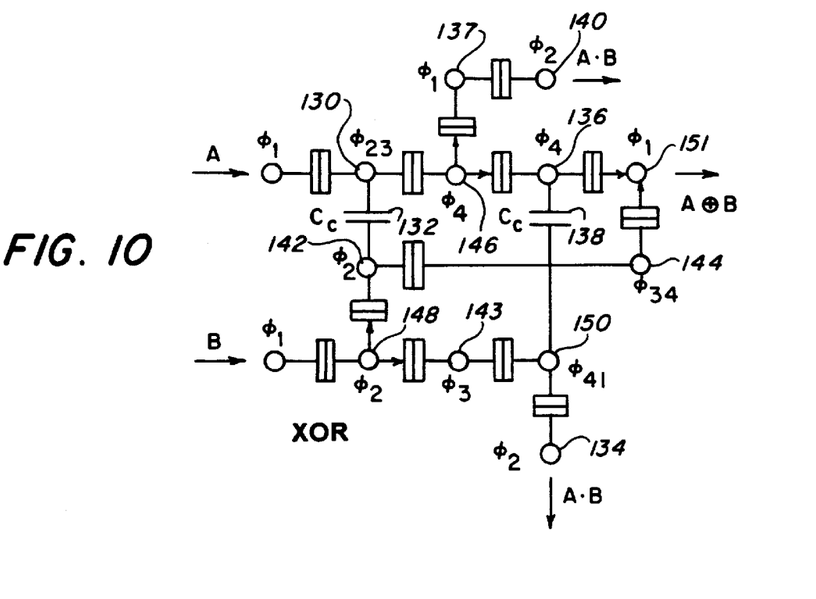
FIG. 10 is a schematic illustrating a circuit for performing exclusive "OR" computations.

FIG. 10 is a circuit which forms the logical "AND," as well as the logical "EXCLUSIVE OR," operation on inputs A and B. The circuit employs a pair of circuits like that of FIG. 9, in which island 130 and capacitor 132, and island 136 and capacitor 138, perform the same switching control as that of island 114 and capacitor 118 of FIG. 9. When the input bit from A and B are both zero, the bits are clocked through the circuit to islands 150 and 134, respectively and a zero output appears at 140, 150, 151, and 134. If electrons are input at both A and B, then electrostatic coupling of the A bit from island 130 to island 142 via capacitor 132 directs the B bit away from 142 towards 150, and similarly electrostatic coupling of the B bit from island 150 to island 136 via capacitor 138 directs the A bit away from 151 and towards 140. If one bit is 1, but not both, then electrostatic screening cannot occur, and the 1 bit preferentially tunnels toward 151, rather than 140 or 150. (In particular, in the absence of electrostatic biasing, an electron in the A bit will preferentially seek island 136 over island 137 because of the former's capacitative loading; and an electron bit will seek island 142 over 143 for the same reason). In this manner, output at 140 and 134 both represent A AND B, whereas output at 151 represents the exclusive OR of A and B.

Figure 11:
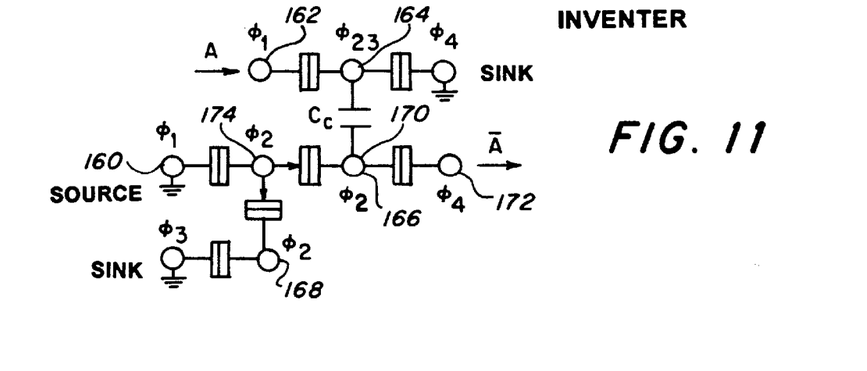
FIG. 11 is a schematic illustrating an inverter circuit.

FIG. 11 shows a digital inverter circuit based on the source-sink circuit of FIG. 6. Source 160 provides a constant stream of electrons, whereas the bits of signal A are synchronously read into island 162, etc. In the absence of electrostatic coupling between islands 164 and 166 electrons from source 160 would tent to branch to island 166, rather than 168, because of the former's capacitive coupling via capacitor 170, ultimately exiting via island 172. However, when an electron bit of A is clocked to island 164, its electrostatic coupling to island 166 repels the electron in island 174, causing it to exit via island 168 and leaving the output at 172 zero. Thus if a bit from A is a logical 1, its synchronous bit from source 160 is blocked via island 162 from output 172, and the output is low. Whereas if a bit from A is a logical 0, then the corresponding electron from source 160 is not blocked and reaches output island 172. In this manner, output at 172 is the logical opposite of signal A.

The invention has been described in what is considered to be the most practical and preferred embodiments. It is recognized, however, that obvious modifications to these embodiments may occur to those with skill in this art. Accordingly, the scope of the invention is to be discerned from reference to the appended claims, wherein:

I claim:

1. A device comprising:
   at least three tunnel junctions disposed in series to form three single electron coulomb blockade islands;
   each said island having a respective gate capacitance $C_g$ and a junction capacitance $C_j$;
   wherein, for each of said islands said $C_g$ and said $C_j$ are chosen to cause the screening length of each said island to be between 0.5 and 1.0 islands, effective to permit bias independent occupancy of said islands.

2. The device of claim 1, wherein each of said islands has an associated control voltage selectably movable between a high and a low state;
   said device having an input for receiving input electrons, and output for discharging electrons;
   each said voltage being capable of moving an electron from the island with which said each said voltage is associated, to the next adjacent of said islands in the direction of said output upon said each said voltage switching to said high state.

3. A plurality of series connected coulomb blockaded islands in which nearest-neighbor islands are connected by a tunnel junction and each of the tunnel junctions of said islands is selected to have a capacitance of about $C_j$, wherein the ratio $C_g/C_j$ for each of said islands is selected to cause the screening length of each of said islands to be between about 0.5 and 1.0 islands, and wherein said $C_g$ is gate capacitance, effective to permit bias independent occupancy of said islands.

4. A device comprising:
   at least three tunnel junctions disposed in series to form two single electron coulomb blockaded islands;
   each of the islands having a respective gate capacitance $C_g$ and each of the tunnel junctions having a respective junction capacitance $C_j$;
   wherein for each of the islands the $C_g$ and the $C_j$ are chosen to cause the screening length of the island to be between 0.5 and 1.0 islands, effective to permit bias independent occupancy of the islands.

5. The device of claim 4, wherein each of the islands has an associated control voltage selectably movable between a high and a low state;
   said device having an input for receiving input electrons, and an output for discharging electrons;
   each of the voltages being capable of moving an electron from the island with which the voltage is associated, to the next adjacent of the islands in the direction of the output upon the voltage switching to the high state.

* * * * *